(12) United States Patent
Katori (10) Patent No.: US 6,274,454 B1
(45) Date of Patent: *Aug. 14, 2001

(54) METHOD FOR FABRICATING DIELECTRIC CAPACITOR

(75) Inventor: Kenji Katori, Kanagawa (JP)

(73) Assignee: Sony Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/236,536

(22) Filed: Jan. 25, 1999

(30) Foreign Application Priority Data

Jan. 30, 1998 (JP) .................................. 10-018718

(51) Int. Cl.$^7$ .................................................. H01L 21/20
(52) U.S. Cl. ................................ 438/396; 438/3; 438/240
(58) Field of Search .............................. 438/3, 240, 253, 438/393, 396

(56) References Cited

U.S. PATENT DOCUMENTS

| | | | |
|---|---|---|---|
| 5,629,229 | * 5/1997 | Si et al. ................................. | 438/3 |
| 5,824,590 | * 10/1998 | New ...................................... | 438/393 |
| 5,877,062 | * 3/1999 | Horii ..................................... | 438/253 |
| 5,962,069 | * 10/1999 | Schindler et al. ....................... | 438/3 |
| 5,994,153 | * 11/1999 | Nagel et al. ............................ | 438/3 |
| 6,001,660 | * 12/1999 | Park et al. .............................. | 438/3 |

* cited by examiner

Primary Examiner—Tuan H. Nguyen
(74) Attorney, Agent, or Firm—Sonnenschein, Nath & Rosenthal (57) ABSTRACT

Disclosed is a method for fabricating a dielectric capacitor that comprises a lower electrode made of at least one of Ir, Pd, Ru and Rh or containing at least one of those elements, a dielectric film of a ferroelectric or high dielectric substance as formed on the lower electrode, and an upper electrode as formed on the dielectric film. The method comprises a first heat treatment step for completing the formation of the dielectric film in an oxygen-containing vapor atmosphere followed by a second heat treatment step to be effected in a nitrogen or inert gas atmosphere at a temperature not lower than that for the first heat treatment. The method solves the problem with the dielectric layer of a ferroelectric substance of SBT or the like, of which the characteristics are worsened after forming gas annealing especially when the dielectric layer is formed on a lower electrode of a noble metal except platinum and gold.

17 Claims, 3 Drawing Sheets

FIG. 1A

(FIRST HEAT TREATMENT STEP)

↓

SECOND HEAT TREATMENT STEP

FIG. 1B ↓

HEAT TREATMENT
↓
CHARACTERISTIC MEASUREMENT
↓
FORMING GAS ANNEALING
↓
RECOVERY ANNEALING
↓
CHARACTERISTIC MEASUREMENT

(FIRST HEAT TREATMENT STEP)

COMPOSITION ANALYSIS THROUGH
X-RAY DIFFRACTOMETRY

REDUCTION STEP

SECOND HEAT TREATMENT STEP

FIG. 2B

HEAT TREATMENT

CHARACTERISTIC MEASUREMENT

FORMING GAS ANNEALING

RECOVERY ANNEALING

CHARACTERISTIC MEASUREMENT

FIG. 2C

FIG. 3A (FIRST HEAT TREATMENT STEP)

↓

REDUCTION STEP

↓

HEAT TREATMENT STEP WITH OXYGEN SUPPLY

↓

SECOND HEAT TREATMENT STEP

HEAT TREATMENT

↓

CHARACTERISTIC MEASUREMENT

↓

FORMING GAS ANNEALING

↓

RECOVERY ANNEALING

↓

CHARACTERISTIC MEASUREMENT

FIG. 3C though the oxidation is promoted to such a high degree that it is detected in analysis, for example, through X-ray diffractometry.

METHOD FOR FABRICATING DIELECTRIC CAPACITOR

RELATED APPLICATION DATA

The present application claims priority to Japanese Application No. P10 018718 filed Jan. 30, 1998 which application is incorporated herein by reference to the extent permitted by law.

BACKGROUND OF THE INVENTION

The present invention relates to a method for fabricating dielectric capacitors, and precisely to a method for fabricating dielectric capacitors usable in ferroelectric nonvolatile memories, etc.

Ferroelectric memories are fast-reloadable nonvolatile ones for which are used high-speed polarization inversion and remanence of ferroelectric thin films. In conventional ferroelectric memories, transistors and ferroelectric capacitors were aligned in the plane direction of a substrate. The ferroelectric capacitor is formed by laminating, on a silicon oxide film, a buffer layer of a titanium metal film having a thickness of 30 nm or so, a lower electrode of, for example, a platinum film having a thickness of 200 nm or so, a ferroelectric film of a PZT [$Pb(Zr,Ti)O_3$] film or SBT ($SrBi_2Ta_2O_9$) film having a thickness of 200 nm or so, and an upper electrode of a platinum film having a thickness of 200 nm or so, in that order.

To increase the information recording density in those memories, transistors and ferroelectric capacitors must be disposed on a substrate in layers, for which the capacitors are so-called stack-type capacitors. In that structure, each transistor is electrically connected with the lower electrode of each ferroelectric capacitor via a silicon plug.

However, reactive ion etching (RIE) of platinum is difficult, and fine working to give capacitors having a lower electrode of platinum is difficult.

Forming a ferroelectric film in capacitor fabrication generally requires heat treatment at high temperatures falling between 600° C. and 800° C., which, however, involves thermal diffusion between a silicon plug and the lower electrode that underlies the film whereby silicon having diffused into the lower electrode is oxidized in the upper layer of the lower electrode to retard the electroconductivity of the lower electrode, or, as the case may be, silicon further diffuses into the ferroelectric film to significantly worsen the capacitor characteristics.

On the other hand, fabricating ordinary MOS memory structures requires forming gas annealing at temperatures falling between 400° C. and 500° C. for transistor recovery, prior to metal wiring operation. However, it is known that such forming gas annealing worsens the characteristics of ferroelectrics such as SBT, etc. In addition, where the lower electrode in capacitors is made of a noble metal except platinum and gold, the noble metal is oxidized through heat treatment for dielectrics. Forming gas annealing after fabrication of ferroelectric capacitors having a lower electrode of a noble metal except platinum and gold much more worsens the dielectric characteristics of the capacitors than those of capacitors where the electrode is made of platinum or the like that is not oxidized at all. This is because the noble metal oxide having formed through the heat treatment for dielectric formation is reduced through the forming gas annealing, thereby bringing about a significant change in the capacitor structure.

SUMMARY OF THE INVENTION

The present invention is to solve the problems with the related art noted above, and its object is to provide a method for fabricating dielectric capacitors. The first embodiment of the invention is a method for fabricating a dielectric capacitor that comprises a lower electrode made of at least one of iridium, palladium, ruthenium and rhodium or containing at least one of those elements, a dielectric film of a ferroelectric or high dielectric substance as formed on the lower electrode, and an upper electrode as formed on the dielectric film, and the method comprises a first heat treatment step for completing the formation of the dielectric film in an oxygen-containing vapor atmosphere followed by a second heat treatment step to be effected in a nitrogen or inert gas atmosphere. The second heat treatment is effected at a temperature not lower than that for the first heat treatment.

In the first embodiment of the method for fabricating the dielectric capacitor, the lower electrode is made of at least one of iridium, palladium, ruthenium and rhodium or contains at least one of those elements. In this, therefore, the lower electrode is etched more easily than platinum electrodes. In addition, in the method, the first heat treatment step for completing the formation of the dielectric film in an oxygen-containing vapor atmosphere is followed by the second heat treatment step to be effected in a nitrogen or inert gas atmosphere at a temperature not lower than that for the first heat treatment. Therefore, in this, even though the lower electrode will be also oxidized in the first heat treatment step, the oxidized part of the lower electrode could be reduced in the second heat treatment step when the oxidation is so minor that it could not be detected in analysis, for example, through X-ray diffractometry.

In the dielectric capacitor thus fabricated in this method, the dielectric film overlies the lower electrode made of or containing the above-mentioned, non-oxidized metal. Therefore, the capacitor has no part to be reduced in the subsequent forming gas annealing, and exhibits stable characteristics. Accordingly, the characteristics of the dielectric capacitor fabricated in this method are prevented from being worsened after forming gas annealing.

The second embodiment of the invention is a method for fabricating a dielectric capacitor that comprises a lower electrode made of at least one of iridium, palladium, ruthenium and rhodium or containing at least one of those elements, a dielectric film of a ferroelectric or high dielectric substance as formed on the lower electrode, and an upper electrode as formed on the dielectric film, and the method comprises a heat treatment step for completing the formation of the dielectric film in an oxygen-containing vapor atmosphere followed by a reduction step for reducing the oxide having been formed in the lower electrode through oxidation in the heat treatment step.

In the second embodiment of the method for fabricating the dielectric capacitor, the lower electrode is etched more easily than platinum electrodes for the same reasons as in the first embodiment noted above. In addition, in the method, the heat treatment step for completing the formation of the dielectric film in an oxygen-containing vapor atmosphere is followed by the reduction step for reducing the oxide having been formed in the lower electrode through oxidation in the heat treatment step. Therefore, in this, the lower electrode will be also oxidized in the heat treatment step but the oxidized part of the lower electrode is reduced in the reduction step, even though the oxidation is promoted to such a high degree that it is detected in analysis, for example, through X-ray diffractometry.

In the dielectric capacitor thus fabricated in this method, the dielectric film overlies the lower electrode made of or containing the above-mentioned, non-oxidized metal.

Therefore, the capacitor has no part to be reduced in the subsequent forming gas annealing, and exhibits stable characteristics. Accordingly, the characteristics of the dielectric capacitor fabricated in this method are prevented from being worsened after forming gas annealing.

The third embodiment of the invention is a method for fabricating a dielectric capacitor that comprises a lower electrode made of at least one of iridium, palladium, ruthenium and rhodium or containing at least one of those elements, a dielectric film of a ferroelectric or high dielectric substance as formed on the lower electrode, and an upper electrode as formed on the dielectric film, and the method comprises a first heat treatment step for completing the formation of the dielectric film in an oxygen-containing vapor atmosphere followed by a reduction step for reducing the oxide having been formed in the lower electrode through oxidation in the first heat treatment step and by a second heat treatment step to be effected after the reduction step in a nitrogen or inert gas atmosphere at a temperature not lower than that for the first heat treatment.

The method may additionally comprise another heat treatment step for oxygen supply to be effected after the reduction step and before the second heat treatment step in an oxygen-containing atmosphere at a temperature lower than that at which the substance having been reduced in the reduction step may be oxidized.

In the third embodiment of the method for fabricating the dielectric capacitor, the lower electrode is etched more easily than platinum electrodes for the same reasons as in the first embodiment noted above. In addition, in the method, the first heat treatment step to be effected in an oxygen-containing vapor atmosphere is followed by the reduction step. Therefore, in this, the lower electrode will be also oxidized in the first heat treatment step but the oxidized part of the lower electrode is reduced in the reduction step, even though the oxidation is promoted to such a relatively high degree that it is detected in analysis through X-ray diffractometry. In addition, in this, the dielectric characteristics of the capacitor fabricated are further improved in the second heat treatment step after the reduction step. The second heat treatment step in the third embodiment differs from that in the first embodiment noted above in that the reduction of the oxidized part of the lower electrode is required in the latter but not in the former. Therefore, the second heat treatment step in the third embodiment does not require such high temperatures as are required by the first heat treatment step therein.

In the dielectric capacitor thus fabricated in this method, the dielectric film overlies the lower electrode made of or containing the above-mentioned, non-oxidized metal. Therefore, the capacitor has no part to be reduced in the subsequent forming gas annealing, and exhibits stable characteristics. Accordingly, the characteristics of the dielectric capacitor fabricated in this method are prevented from being worsened after forming gas annealing.

In the method that further comprises the additional heat treatment step for oxygen supply to be effected after the reduction step and before the second heat treatment step in an oxygen-containing atmosphere at a temperature lower than that at which the substance having been reduced in the reduction step may be oxidized, oxygen may well be supplied to the dielectric film without oxidizing the lower electrode even when the dielectric film is in an oxygen-poor condition as a result of its reduction in the previous reduction step.

BRIEF DESCRIPTION OF THE DRAWINGS

FIG. 1A to FIG. 1C are graphical views showing the first embodiment of the method for fabricating a dielectric capacitor of the invention.

FIG. 2A to FIG. 2C are graphical views showing the second embodiment of the method for fabricating a dielectric capacitor of the invention.

FIG. 3A to FIG. 3C are graphical views showing the third embodiment of the method for fabricating a dielectric capacitor of the invention.

DESCRIPTION OF THE PREFERRED EMBODIMENTS

One example of the first embodiment of the method for fabricating a dielectric capacitor of the invention is described with reference to FIG. 1A to FIG. 1C. In the following description, the names of substances are indicated by the symbols of elements.

Figure 1A:
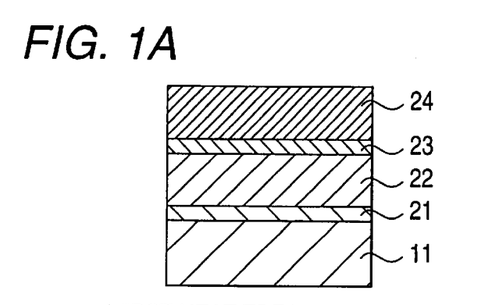

As in FIG. 1A, a Ti film to be a bonding layer 21 is formed through sputtering on an Si substrate 11 to have a thickness of, for example, 20 nm; then IrHfO to be a diffusion-preventing layer 22 is deposited thereover to have a thickness of, for example, 100 nm; and Ir to be a lower electrode 23 is formed thereover to have a thickness of, for example, 20 nm. In this, the lower electrode 23 is made of Ir, but may also be made of any of Pd, Ru and Rh.

Next, a film of SBT is formed over the lower electrode 23 in a sol-gel rotary coating method. As the sol-gel source (not shown) for this, for example, used is a liquid composition of Sr 0.8/Bi 2.2/Ta 2.0. The liquid sol-gel source is applied onto the lower electrode 23 according to a rotary coating method, and baked to remove the organic solvent from the resulting film (not shown). The baking may be effected, for example, in air at 250° C. for 7 minutes. Next, this is subjected to a first heat treatment step for rapid thermal annealing (RTA) to give SBT phyllo-perovskite crystals. As one example of the condition for RTA, the vapor atmosphere is comprised of $N_2$ and $O_2$ in a ratio of 4/1 by volume, the heating rate is 760° C./10 sec, the ultimate temperature is 760° C., and the substrate is kept at the ultimate temperature for 30 seconds. The RTA atmosphere is the mixed gas of $N_2$ and $O_2$, which could minimize the oxidation of Ir that constitutes the lower electrode 23. The process of sol-gel rotary coating and RTA is repeated three times to give a dielectric film 24 of thin SBT having a thickness of 170 nm.

Next, the dielectric film 24 of thin SBT is subjected to a second heat treatment step in an $N_2$ or inert gas atmosphere at a temperature not lower than that for the first heat treatment. For this, for example, the dielectric film 24 is heated in an $N_2$ atmosphere at 800° C. for 1 hour. As a result of this second heat treatment, the oxide having been formed in the lower electrode 23 is reduced.

Figure 1B:
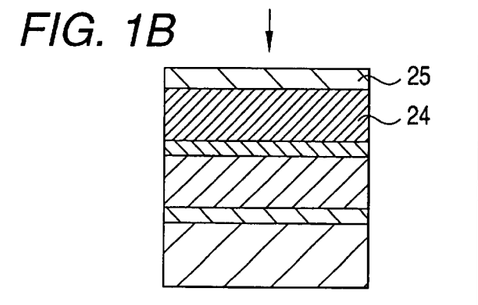
Figure 1C:
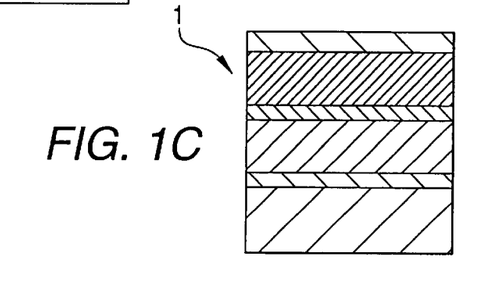

Next, as in FIG. 1B, an upper electrode 25 of Pt is formed on the dielectric film 24, and then heated in a nitrogen atmosphere at 650° C. for 10 minutes. After this, the ferroelectric characteristics of the dielectric film 24 are measured. In this example, $2Pr=20 \mu C/cm^2$, and $2Vc=1.8$ V. These data of 2Pr and 2Vc indicate that the dielectric film 24 of ferroelectric SBT is good.

Next, this is subjected to forming gas annealing (in a vapor mixture of $N_2/H_2=96/4$ by volume, at 400° C. for 1 hour) and then to recovery annealing (in $N_2$ at 450° C. for 30 minutes), and the ferroelectric characteristics of the dielectric film 24 are again measured. In this, $2Pr=20$ $\mu C/cm^2$ and $2Vc=1.8$ V, which are the same as those before forming gas annealing. As a result of this process illustrated herein, obtained is a dielectric capacitor 1 having good resistance to forming gas annealing, as in FIG. 1C.

In order to obtain the dielectric capacitor 1 having good resistance to forming gas annealing, the structure that comprises the bonding layer 21 having a thickness of 20 nm, the diffusion-preventing layer 22 of IrHfO as formed on the layer 21 to have a thickness of 100 nm and the lower electrode 23 of Ir having a thickness of 20 nm must be subjected to the second heat treatment in a nitrogen or inert gas atmosphere at a temperature not lower than 770° C.

In order to overcome the difficulty in etching the upper electrode 25, it is desirable that the upper electrode 25 is also made of a noble metal except Pt and Au, such as Ir, Pd, Ru or Rh, like the lower electrode 23. However, the upper electrode 25 has a greater influence on the dielectric characteristics of the capacitor than the lower electrode 23. Therefore, in this embodiment, the upper electrode 25 is made of Pt as having better repetitive reproducibility.

In the first embodiment of dielectric capacitor fabrication mentioned hereinabove, the lower electrode 23 is made of Ir, and therefore can be etched more easily than Pt electrodes. In this, in addition, the dielectric film 24 having been formed as a result of the first heat treatment step as effected in the $O_2$-containing vapor atmosphere is subjected to the second heat treatment. Therefore, in this, even though the lower electrode 23 is also oxidized in the first heat treatment step, the oxidized part of the lower electrode 23 is reduced in the second heat treatment step.

In the dielectric capacitor 1 fabricated in this method, the dielectric film 24 overlies the lower electrode 23 of non-oxidized Ir. Therefore, the capacitor 1 has no part that may be reduced in the subsequent forming gas annealing, and exhibits stable dielectric characteristics. Accordingly, the characteristics of the dielectric capacitor 1 fabricated in this method are prevented from being worsened after forming gas annealing.

A comparative example to the first embodiment of the invention is mentioned below, in which the same constituent parts as in the first embodiment are indicated by the same numeral references as therein so as to ensure easy comparison between the comparative example and the first embodiment.

In the comparative example, the dielectric film 24 of thin SBT is heated in an $O_2$ atmosphere at 800° C. for 1 hour for the second heat treatment, but not in an $N_2$ atmosphere at 800° C. for 1 hour. The other steps for the comparative example are the same as those for the first embodiment of the invention mentioned hereinabove.

After the process, an upper electrode 25 of Pt is formed on the dielectric film 24, and then heated in an $N_2$ atmosphere at 650° C. for 10 minutes, and the ferroelectric characteristics of the dielectric film 24 are measured. In the comparative example, $2Pr=20 \ \mu C/cm^2$, and $2Vc=1.8$ V. In this stage, the data of 2Pr and 2Vc indicate that the dielectric film 24 of ferroelectric SBT is good.

Next, this is subjected to forming gas annealing and then to recovery annealing in the same manner as in the first embodiment of the invention mentioned above. Measurement of the ferroelectric characteristics of the dielectric film 24 in the capacitor fabricated in this comparative example was tried but was impossible as the capacitor entirely short-circuited. As in this comparative example where ordinary heat treatment in an $O_2$ atmosphere is employed in forming the dielectric film over the lower electrode 23 of Ir, the capacitor fabricated could not have resistance to forming gas annealing.

As in the first embodiment of the invention mentioned above, the second heat treatment must be effected in an $N_2$ (or inert gas) atmosphere at a temperature not lower than that for the first heat treatment to prevent the dielectric characteristics of the capacitor from being worsened.

One example of the second embodiment of the method for fabricating a dielectric capacitor of the invention is described with reference to FIG. 2A to FIG. 2C, in which the same constituent parts as in FIG. 1A to FIG. 1C for the first embodiment are indicated by the same numeral references as therein, Also in the following description, the names of substances are indicated by the symbols of elements.

Figure 2A:
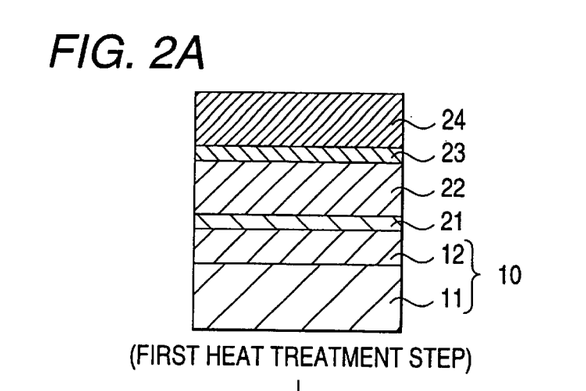
Figure 2B:
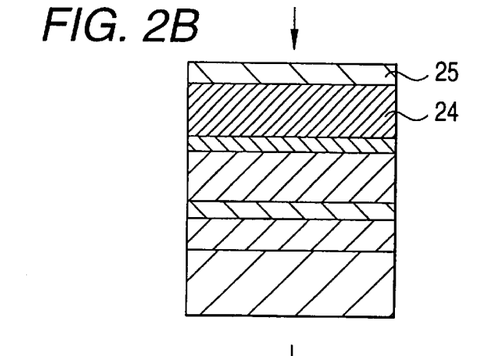
Figure 2C:
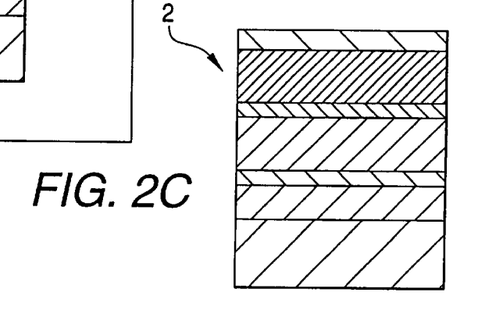

In the second embodiment, used is a substrate 10 which is composed of an Si substrate 11 and an $SiO_2$ film as formed thereon to have a thickness of, for example, 300 nm, as in FIG. 2A. In the same manner as in the first embodiment mentioned above, a Ti film to be a bonding layer 21 is formed through sputtering on the substrate 10 to have a thickness of, for example, 20 nm; then IrHfO to be a diffusion-preventing layer 22 is deposited thereover to have a thickness of, for example, 100 nm; and Ir to be a lower electrode 23 is formed thereover to have a thickness of, for example, 20 nm.

Next, also in the same manner as in the first embodiment, a film of SBT is formed over the lower electrode 23 in a sol-gel rotary coating method, and then baked to remove the organic solvent from it. Next, this is subjected to a heat treatment step (this corresponds to the first heat treatment step in the first embodiment mentioned above) for RTA to give SBT phyllo-perovskite crystals. The process of sol-gel rotary coating and RTA is repeated three times to give a dielectric film 24 of thin SBT having a thickness of 170 nm. X-ray diffractometric analysis of the coated substrate gave a peak for the oxide, $IrO_2$ formed in the lower electrode.

Next, this is subjected to a reduction step of heat treatment in a mixed vapor atmosphere of $N_2$ and $H_2$ ($N_2/H_2=96/4$ by volume) at 400° C. for 1 hour. After the reduction, the peak for $IrO_2$ disappeared in X-ray diffractometry. This verifies the reduction of the oxidized part (not shown) of the lower electrode 23.

Next, the dielectric film 24 of thin SBT is subjected to a second heat treatment step in a nitrogen atmosphere at 750° C. for 1 hour. This second heat treatment step is for crystallizing the dielectric film 24 without oxidizing the lower electrode 23 of Ir, in which, therefore, the heat treatment may be effected in $N_2$ as herein, or in an inert gas atmosphere, at a temperature falling between 700° C. and 750° C. or so.

Next, in the same manner as in the first embodiment, the dielectric film 24 is coated with a film of Pt to be an upper electrode 25, as in FIG. 2B, and then again heated in a nitrogen atmosphere at 650° C. for 10 minutes. After this, the ferroelectric characteristics of the dielectric film 24 are measured. In this example, $2Pr=19 \ \mu C/cm^2$, and $2Vc=1.8$ V. These data of 2Pr and 2Vc indicate that the dielectric film 24 of ferroelectric SBT is good.

Next, this is subjected to forming gas annealing (in a vapor mixture of $N_2/H_2=96/4$ by volume, at 400° C. for 1 hour) and then to recovery annealing (in $N_2$ at 450° C. for 30 minutes), and the ferroelectric characteristics of the dielectric film 24 are again measured. In this, $2Pr=19 \ \mu C/cm^2$ and $2Vc=1.8$ V, which are the same as those before forming gas annealing. As a result of this process illustrated herein, obtained is a dielectric capacitor 2 having good resistance to forming gas annealing, as in FIG. 2C.

In the second embodiment, the lower electrode 23 is reduced in a hydrogen-containing vapor atmosphere, being different from that in the first embodiment. Therefore, in the second embodiment, the second heat treatment does not require high temperatures of 770° C. or higher as in the first embodiment, but may be effected at a temperature falling between 700° C. and 750° C. or so to obtain the capacitor 2 having good ferroelectric characteristics.

In order to overcome the difficulty in etching the upper electrode 25, it is desirable that the upper electrode 25 is also made of a noble metal except Pt and Au, such as Ir, Pd, Ru or Rh, like the lower electrode 23, as so mentioned hereinabove for the first embodiment. However, the upper electrode 25 has a greater influence on the dielectric characteristics of the capacitor than the lower electrode 23. Therefore, in this embodiment, the upper electrode 25 is made of Pt as having better repetitive reproducibility.

In the second embodiment of dielectric capacitor fabrication mentioned hereinabove, the lower electrode 23 is made of Ir, and therefore can be etched more easily than Pt electrodes, for the same reasons as those mentioned hereinabove for the first embodiment. In this, in addition, the dielectric film 24 having been formed as a result of the heat treatment step as effected in the $O_2$-containing vapor atmosphere is subjected to the reduction step. Therefore, in this, the lower electrode 23 is also oxidized in the heat treatment step but the oxidized part of the lower electrode 23 is reduced in the reduction step, even though the oxidation is promoted to such a high degree that it is detected in analysis, for example, through X-ray diffractometry. In the dielectric capacitor 2 fabricated in this method, the dielectric film 24 overlies the lower electrode 23 of non-oxidized Ir. Therefore, the capacitor 2 has no part that may be reduced in the subsequent forming gas annealing, and exhibits stable dielectric characteristics. Accordingly, the characteristics of the dielectric capacitor 2 fabricated in this method are prevented from being worsened after forming gas annealing.

A comparative example to the second embodiment of the invention is mentioned below, in which the same constituent parts as in the second embodiment are indicated by the same numeral references as therein so as to ensure easy comparison between the comparative example and the second embodiment.

In the comparative example, the reduction step taken in the second embodiment is omitted but the other steps are the same as those in the second embodiment mentioned hereinabove. After having been subjected to forming gas annealing followed by recovery annealing, the capacitor was tested to measure the ferroelectric characteristics of the dielectric film 24 but in vain, as it entirely short-circuited. As in this comparative example where the reduction of the lower electrode 23 of Ir is omitted, the capacitor fabricated could not have resistance to forming gas annealing.

As in the second embodiment of the invention mentioned above, the reduction step makes it possible to prevent the dielectric characteristics of the capacitor from being worsened.

Figures 3A, 3B, 3C:
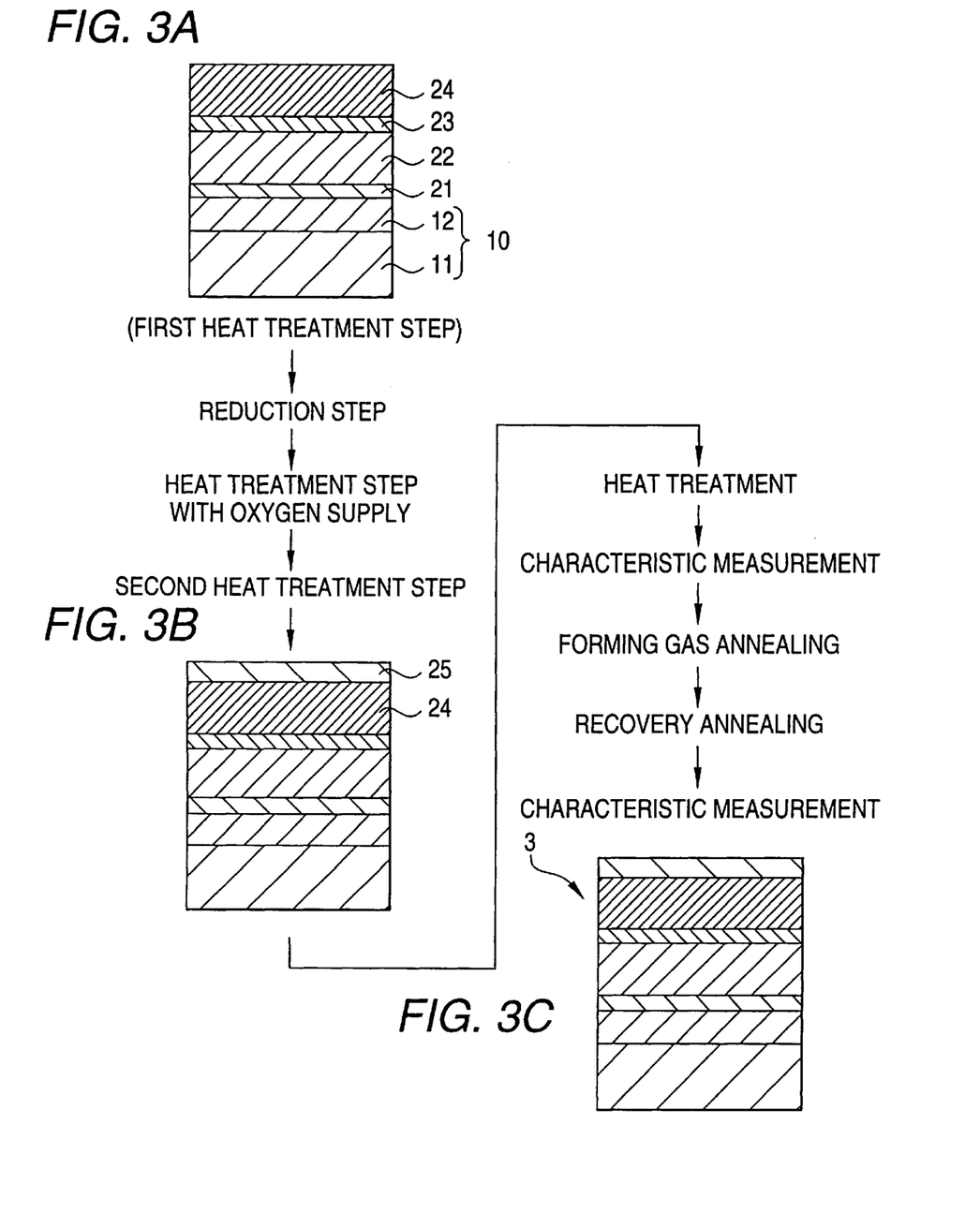

The third embodiment of the invention is illustrated in FIG. 3A to FIG. 3C. As in FIG. 3A, an $SiO_2$/Si substrate 10 as prepared by forming an $SiO_2$ film 12 of, for example, 300 nm thick on an Si substrate 11 is used in the third embodiment. Though not shown, the Si substrate 11 only may be used herein. In the same manner as in the first embodiment mentioned above, a Ti film to be a bonding layer 21 is formed through sputtering on the substrate 10 to have a thickness of, for example, 20 nm; then IrHfO to be a diffusion-preventing layer 22 is deposited thereover to have a thickness of, for example, 100 nm; and Ir to be a lower electrode 23 is formed thereover to have a thickness of, for example, 20 nm.

Next, a film of SBTN is formed over the lower electrode 23 in a sol-gel rotary coating method. As the sol-gel source for this, for example, used is a liquid composition of Sr 0.8/Bi 2.2/Ta 1.75/Nb 0.25. The liquid sol-gel source is applied onto the lower electrode 23, and baked to remove the organic solvent from the resulting film, in the same manner as in the first embodiment mentioned above. Next, this is subjected to a first heat treatment step for rapid thermal annealing (RTA) to give SBTN phyllo-perovskite crystals. As one example of the condition for RTA, the vapor atmosphere is comprised of $N_2$ and $O_2$ in a ratio of 4/1 by volume, the heating rate is 740° C./10 sec, the ultimate temperature is 740° C., and the substrate is kept at the ultimate temperature for 30 seconds. The RTA atmosphere is the mixed gas of $N_2$ and $O_2$, which could minimize the oxidation of Ir that constitutes the lower electrode 23. The process of sol-gel rotary coating and RTA is repeated three times to give a dielectric film 24 of thin SBTN having a thickness of 170 nm.

Next, this is subjected to a reduction step of heat treatment in a mixed vapor atmosphere of $N_2$ and $H_2$ ($N_2/H_2$=96/4 by volume) at 400° C. for 1 hour.

Next, this is subjected to a heat treatment step for oxygen supply to the thin SBTN film formed on the lower electrode 23, for which the film is heated in an $O_2$ atmosphere at 400° C. for 1 hour. The temperature for the heat treatment may fall between 250° C. and 650° C., preferably between 350° C. and 500° C., when the lower electrode is made of Ir; or between 250° C. and 600° C., preferably between 350° C. and 500° C., when the lower electrode is made of Pd; or between 250° C. and 600° C., preferably between 350° C. and 500° C., when the lower electrode is made of Ru; or between 250° C. and 600° C., preferably between 350° C. and 500° C., when the lower electrode is made of Rh.

Next, the dielectric film 24 of thin SBTN is subjected to a second heat treatment step in a nitrogen atmosphere at 750° C. for 1 hour. This second heat treatment step is for crystallizing the dielectric film 24 without oxidizing the lower electrode 23 of Ir, in which, therefore, the heat treatment may be effected in $N_2$ as herein, or in an inert gas atmosphere, at a temperature falling between 700° C. and 750° C. or so.

Next, in the same manner as in the first embodiment, the dielectric film 24 is coated with a film of Pt to be an upper electrode 25, as in FIG. 3B, and then again heated in a nitrogen atmosphere at 650° C. for 10 minutes. After this, the ferroelectric characteristics of the dielectric film 24 are measured. In this example, 2Pr=18 $\mu C./cm^2$, and 2Vc=2.0 V. These data of 2Pr and 2Vc indicate that the dielectric film 24 of ferroelectric SBTN is good.

Next, this is subjected to forming gas annealing (in a vapor mixture of $N_2/H_2$=96/4 by volume, at 400° C. for 1 hour) and then to recovery annealing (in $N_2$ at 450° C. for 30 minutes), and the ferroelectric characteristics of the dielectric film 24 are again measured. In this, 2Pr=18 $\mu C/cm^2$ and 2Vc=2.0 V, which are the same as those before forming gas annealing. As a result of this process illustrated herein, obtained is a dielectric capacitor 3 having good resistance to forming gas annealing, as in FIG. 3C.

In the third embodiment, the lower electrode 23 is reduced in a hydrogen-containing vapor atmosphere, being different from that in the first embodiment. Therefore, in the third embodiment, the second heat treatment does not require high temperatures of 770° C. or higher as in the first embodiment, but may be effected at a temperature falling between 700° C. and 750° C. or so to obtain the capacitor 3 having good ferroelectric characteristics.

In order to overcome the difficulty in etching the upper electrode 25, it is desirable that the upper electrode 25 is also made of a noble metal except Pt and Au, such as Ir, Pd, Ru or Rh, like the lower electrode 23, as so mentioned hereinabove for the first embodiment. However, the upper electrode 25 has a greater influence on the dielectric characteristics of the capacitor than the lower electrode 23. Therefore, in this embodiment, the upper electrode 25 is made of Pt as having better repetitive reproducibility.

In the third embodiment of dielectric capacitor fabrication mentioned hereinabove, the lower electrode 23 is made of Ir, and therefore can be etched more easily than Pt electrodes, for the same reasons as those mentioned hereinabove for the first embodiment. In this, in addition, the dielectric film 24 having been formed as a result of the heat treatment step as effected in the $O_2$-containing vapor atmosphere is subjected to the reduction step. Therefore, in this, the lower electrode 23 is also oxidized in the heat treatment step but the oxidized part of the lower electrode 23 is reduced in the reduction step, even though the oxidation is promoted to such a degree that it is detected in analysis, for example, through X-ray diffractometry.

The third embodiment illustrated herein comprises the additional heat treatment step for oxygen supply. In this, therefore, oxygen may well be supplied to the dielectric film 24 even when the dielectric film 24 is in an oxygen-poor condition as a result of its reduction in the previous reduction step. In addition, the lower electrode 23 is not oxidized in this heat treatment step, since the temperature for the heat treatment in the step is not enough for the oxidization of the lower electrode 23.

In the dielectric capacitor 3 fabricated in this method, the dielectric film 24 overlies the lower electrode 23 of non-oxidized Ir. Therefore, the capacitor 3 has no part that may be reduced in the subsequent forming gas annealing, and exhibits stable dielectric characteristics. Accordingly, the characteristics of the dielectric capacitor 3 fabricated in this method are prevented from being worsened after forming gas annealing.

A comparative example to the third embodiment of the invention is mentioned below, in which the same constituent parts as in the second embodiment are indicated by the same numeral references as therein so as to ensure easy comparison between the comparative example and the third embodiment.

In the comparative example, the heat treatment in $O_2$ at 400° C. taken after the reduction step in the third embodiment is omitted but the other steps are the same as those in the third embodiment mentioned hereinabove. After having been subjected to forming gas annealing followed by recovery annealing, the capacitor was tested to measure the ferroelectric characteristics of the dielectric film 24. As a result, in one comparative capacitor in which the substrate 10 was comprised of the Si substrate 11 and the $SiO_2$ film 12 formed thereon, 2Pr=18 $\mu C/cm^2$ and 2Vc=1.8 V. These data of 2Pr and 2Vc indicate that the dielectric film 24 of ferroelectric SBTN formed on the $SiO_2$/Si substrate 10 is good. On the other hand, in another comparative capacitor in which the substrate 10 was the Si substrate 11 only, 2Pr=14 $\mu C/cm^2$ and 2Vc=2.2 V. These data indicate that the capacitor having the Si substrate 11 not coated with $SiO_2$ is not good.

$SiO_2$ has low thermal conductivity. Therefore, in the first heat treatment step for RTA, the substantial temperature of the lower electrode 23 formed on the $SiO_2$/Si substrate 10 is higher than that of the lower electrode 23 formed on the Si substrate 11 not coated with $SiO_2$, thereby resulting in that the amount of the oxide formed in the lower electrode 23 on the $SiO_2$/Si substrate 10 after RTA is larger than that of the oxide formed in the lower electrode 23 on the Si substrate 11 not coated with $SiO_2$. In such different conditions, where the lower electrode 23 is reduced to the same degree, one on the Si substrate 11 not coated with $SiO_2$ is reduced more than the other on the $SiO_2$/Si substrate 10, thereby resulting in that the dielectric film 24 on the former is in an oxygen-poor condition. In those conditions, where the dielectric film 24 is heated for oxygen supply in an $O_2$-containing atmosphere at a temperature at which any of Ir, Pd, Rh and Rh is not oxidized, oxygen may well be supplied to the dielectric film 24 without oxidizing the lower electrode 23. For these reasons, in the third embodiment of the invention, the dielectric capacitor 3 having good resistance to forming gas annealing can be fabricated on any of the Si substrate 11 not coated with $SiO_2$ or the $SiO_2$/Si substrate 10.

In the first to third embodiments of the invention concretely illustrated hereinabove, the lower electrode 23 is made of Ir, which, however, is not limitative. Using lower electrodes made of at least one of Pd, Ru and Rh or containing at least one of those elements also produces the same results as above. In those embodiments, the dielectric film 24 is made of SBT or SBTN, which is not also limitative. Using dielectric films of any other ferroelectric or high dielectric substances such as PZT, BST [(Ba,Sr)TiO$_3$] and others also produces the same results as above.

In the first to third embodiments concretely illustrated hereinabove, the diffusion-preventing layer 22 is made of IrHfO. In the invention, the substance for the diffusion-preventing layer 22 may be represented by Ir—M—O where M is at least one selected from hafnium (Hf), tantalum (Ta), zirconium (Zr), niobium (Nb), vanadium (V), molybdenum (Mo), tungsten (W), yttrium (Y) and rare earth metal elements. The diffusion-preventing layer 22 prevents the thermal diffusion of Si from the underlying Si plug to the lower electrode even when the ferroelectric film is formed in ordinary high-temperature heat treatment at high temperatures falling between 600° C. and 800° C. As a result, Si is prevented from diffusing into the upper layer of the lower electrode and even into the dielectric film that overlies the lower electrode. If not, Si having diffused into the upper layer of the lower electrode is oxidized to retard the electroconductivity of the lower electrode, and, in addition, Si will further diffuse into the dielectric film to greatly worsen the characteristics of the capacitor.

In the first to third embodiments concretely illustrated hereinabove, the dielectric film 24 is made of SBT, SBTN or the like. In the invention, the dielectric film 24 may be made of any ferroelectric substance in which the essential crystalline layers are of a substance to be represented by the following chemical formula (1) and contain oxides of at least one of Bi, Ta and Nb (the oxides also include composite oxides of at least two of Bi, Ta and Nb).

$$Bi_x(Sr,Ca,Ba)_y(Ta,Nb)_2O_z \tag{1}$$

wherein $1.70 \leq x \leq 2.50$, $0.60 \leq y \leq 1.20$, $z=9\pm d$, $0 \leq d \leq 1.0$.

Apart from this, the dielectric film 24 may also be made of a ferroelectric substance in which the essential crystalline layers are of a substance to be represented by the following chemical formula (2) and contain oxides of at least one of Bi and Ta (the oxides also include composite oxides of both Bi and Ta).

$$Bi_xSr_yTa_2O_z \tag{2}$$

wherein $1.70 \leq x \leq 2.50$, $0.60 \leq y \leq 1.20$, $z=9\pm d$, $0 \leq d \leq 1.0$.

In addition, the dielectric film 24 may be of a high dielectric substance such as PZT, BST, etc.

In the first to third embodiments concretely illustrated hereinabove, the dielectric film 24 is formed according to a sol-gel rotary coating method. Apart from this, the film 24 may also be formed according to any other method of, for example, CVD, sputtering or the like.

The invention has been described in detail hereinabove with reference to its preferred embodiments. In the first embodiment of the invention for dielectric capacitor fabrication where a dielectric film is formed on a lower electrode of Ir, Pd, Ru or Rh, the heat treatment (first heat treatment) for forming the dielectric film in an oxygen-containing atmosphere gives an oxide in the lower electrode. In this, however, the oxide formed is reduced in the second heat treatment. Accordingly, since the lower electrode is not oxidized in this embodiment, it is not reduced in the subsequent forming gas annealing for recovery of transistor characteristics. As a result, the dielectric capacitor as fabricated in the first embodiment of the invention has good resistance to forming gas annealing.

In the second embodiment of the invention for dielectric capacitor fabrication where a dielectric film is formed on a lower electrode of Ir, Pd, Ru or Rh, the heat treatment (first heat treatment) for forming the dielectric film in an oxygen-containing atmosphere gives an oxide in the lower electrode. In this, however, the oxide formed is reduced in the reduction step. Accordingly, since the lower electrode is not oxidized in this embodiment, it is not reduced in the subsequent forming gas annealing for recovery of transistor characteristics. As a result, the dielectric capacitor as fabricated in the second embodiment of the invention has good resistance to forming gas annealing.

In the third embodiment of the invention for dielectric capacitor fabrication where a dielectric film is formed on a lower electrode of Ir, Pd, Ru or Rh, the heat treatment (first heat treatment) for forming the dielectric film in an oxygen-containing atmosphere gives an oxide in the lower electrode. In this, however, the oxide formed is reduced in the reduction step. Accordingly, since the lower electrode is not oxidized in this embodiment, it is not reduced in the subsequent forming gas annealing for recovery of transistor characteristics. As a result, the dielectric capacitor as fabricated in the third embodiment of the invention has good resistance to forming gas annealing. In addition, even if the dielectric film is in an oxygen-poor condition after the reduction step, it is subjected to additional heat treatment for oxygen supply thereto in an oxygen-containing atmosphere that does not oxidize the lower electrode. In this additional heat treatment step, oxygen may well be supplied to the dielectric film whereby the characteristics of the dielectric film are prevented from being worsened.

While the invention has been described in detail and with reference to specific embodiments thereof, it will be apparent to one skilled in the art that various changes and modifications can be made therein without departing from the spirit and scope thereof.

What is claimed is:

1. A method for fabricating a dielectric capacitor comprising the steps of:

employing a lower electrode made of at least one of iridium, palladium, ruthenium and rhodium or containing at least one of those elements, a dielectric film of a ferroelectric or high dielectric substance as formed on said lower electrode, and an upper electrode as formed on said dielectric film; and providing a heat treatment step for completing the formation of said dielectric film in an oxygen-containing vapor atmosphere followed by a reduction step for reducing the oxide having been formed in said lower electrode through oxidation in said heat treatment step.

2. The method for producing a dielectric capacitor as claimed in claim 1, wherein a diffusion-preventing layer that comprises;

iridium, at least one of hafnium, tantalum, zirconium, niobium, vanadium, molybdenum, tungsten, yttrium and rare earth metal elements, and oxygen, is formed below said lower electrode.

3. The method for producing a dielectric capacitor as claimed in claim 1, wherein said dielectric film is of a bismuth phyllo-perovskite structured, ferroelectric substance.

4. The method for producing a dielectric capacitor as claimed in claim 3, wherein said ferroelectric substance comprises essential crystalline layers of a substance to be represented by the following chemical formula and said crystalline layers contain oxides of at least one of bismuth, tantalum and niobium:

wherein $1.70 \leq x \leq 2.50$, $0.60 \leq y \leq 1.20$, $z=9\pm d$, $0 \leq d \leq 1.0$.

5. The method for producing a dielectric capacitor as claimed in claim 3, wherein said ferroelectric substance comprises essential crystalline layers of a substance to be represented by the following chemical formula and said crystalline layers contain oxides of at least one of bismuth and tantalum:

wherein $1.70 \leq x \leq 2.50$, $0.60 \leq y \leq 1.20$, $z=9\pm d$, $0 \leq d \leq 1.0$.

6. The method for fabricating a dielectric capacitor as claimed in claim 1 wherein said lower electrode is made of at least rhodium.

7. A method for fabricating a dielectric capacitor comprising the steps of:

employing a lower electrode made of at least one of iridium, palladium, ruthenium and rhodium or containing at least one of those elements, a dielectric film of a ferroelectric or high dielectric substance as formed on said lower electrode, and an upper electrode as formed on said dielectric film; and providing a first heat treatment step for completing the formation of said dielectric film in an oxygen-containing vapor atmosphere followed by a reduction step for reducing the oxide having formed in said lower electrode through oxidation in said first heat treatment step; and providing a second heat treatment step to be effected after the reduction step in a nitrogen or inert gas atmosphere.

8. The method for producing a dielectric capacitor as claimed in claim 7, which additionally comprises another heat treatment step for oxygen supply to be effected after said reduction step and before said second heat treatment step in an oxygen-containing atmosphere at a temperature lower than that at which the substance having been reduced in said reduction step may be oxidized.

9. The method for producing a dielectric capacitor as claimed in claim 8, wherein a diffusion-preventing layer that comprises;

iridium,
at least one of hafnium, tantalum, zirconium, niobium, vanadium, molybdenum, tungsten, yttrium and rare earth metal elements, and
oxygen, is formed below said lower electrode.

10. The method for producing a dielectric capacitor as claimed in claim 8, wherein said dielectric film is of a bismuth phyllo-perovskite structured, ferroelectric substance.

11. The method for producing a dielectric capacitor as claimed in claim 10, wherein said ferroelectric substance comprises essential crystalline layers of a substance to be represented by the following chemical formula and said crystalline layers contain oxides of at least one of bismuth, tantalum and niobium:

$$Bi_x(Sr,Ca,Ba)_y(Ta,Nb)_2O_z$$

wherein $1.70 \leq x \leq 2.50$, $0.60 \leq y \leq 1.20$, $z=9\pm d$, $0 \leq d \leq 1.0$.

12. The method for producing a dielectric capacitor as claimed in claim 10, wherein said ferroelectric substance comprises essential crystalline layers of a substance to be represented by the following chemical formula and said crystalline layers contain oxides of at least one of bismuth and tantalum:

$$Bi_xSr_yTa_2O_z$$

wherein $1.70 \leq x \leq 2.50$, $0.60 \leq y \leq 1.20$, $z=9\pm d$, $0 \leq d \leq 1.0$.

13. The method for producing a dielectric capacitor as claimed in claim 7, wherein a diffusion-preventing layer that comprises;
iridium,
at least one of hafnium, tantalum, zirconium, niobium, vanadium, molybdenum, tungsten, yttrium and rare earth metal elements, and
oxygen, is formed below said lower electrode.

14. The method for producing a dielectric capacitor as claimed in claim 7, wherein said dielectric film is of a bismuth phyllo-perovskite structured, ferroelectric substance.

15. The method for producing a dielectric capacitor as claimed in claim 14, wherein said ferroelectric substance comprises essential crystalline layers of a substance to be represented by the following chemical formula and said crystalline layers contain oxides of at least one of bismuth, tantalum and niobium:

$$Bi_x(Sr,Ca,Ba)_y(Ta,Nb)_2O_z$$

wherein $1.70 \leq x \leq 2.50$, $0.60 \leq y \leq 1.20$, $z=9\pm d$, $0 \leq d \leq 1.0$.

16. The method for producing a dielectric capacitor as claimed in claim 14, wherein said ferroelectric substance comprises essential crystalline layers of a substance to be represented by the following chemical formula and said crystalline layers contain oxides of at least one of bismuth and tantalum:

$$Bi_xSr_yTa_2O_z$$

wherein $1.70 \leq x \leq 2.50$, $0.60 \leq y \leq 1.20$, $z=9\pm d$, $0 \leq d \leq 1.0$.

17. The method for fabricating a dielectric capacitor as claimed in claim 7 wherein said lower electrode is made of at least rhodium.

* * * * *